(12) United States Patent
Takakura et al.

(10) Patent No.: US 10,634,754 B2
(45) Date of Patent: Apr. 28, 2020

(54) CORRECTION DEVICE, CORRECTION METHOD, AND MAGNETIC RESONANCE IMAGING APPARATUS

(71) Applicant: Kabushiki Kaisha Toshiba, Tokyo (JP)

(72) Inventors: Shinji Takakura, Kanagawa (JP); Shigen Yasunaka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 224 days.

(21) Appl. No.: 15/693,322

(22) Filed: Aug. 31, 2017

(65) Prior Publication Data
US 2018/0100909 A1    Apr. 12, 2018

(30) Foreign Application Priority Data

Oct. 11, 2016 (JP) .................................. 2016-200198

(51) Int. Cl.
*G01R 33/565* (2006.01)
*G01R 33/385* (2006.01)
(Continued)

(52) U.S. Cl.
CPC ... *G01R 33/56518* (2013.01); *G01R 33/3852* (2013.01); *G01R 33/5608* (2013.01); *G05B 13/02* (2013.01); *H03F 1/00* (2013.01)

(58) Field of Classification Search
CPC .......... G01R 33/56518; G01R 33/3852; G01R 33/5608
See application file for complete search history.

(56) References Cited

U.S. PATENT DOCUMENTS 4,928,063 A * 5/1990 Lampman .......... G01R 33/3852
324/307
5,200,701 A   4/1993 Siebold et al.
(Continued)

FOREIGN PATENT DOCUMENTS

JP          3848005       9/2006
JP        2010-88644      4/2010
(Continued)

OTHER PUBLICATIONS

Extended European Search Report issued by the European Patent Office dated Apr. 19, 2018, for European Application No. 17187035.5.

*Primary Examiner* — Dixomara Vargas
(74) *Attorney, Agent, or Firm* — Finnegan, Henderson, Farabow, Garrett & Dunner, L.L.P.

(57) ABSTRACT

According to one embodiment, a correction device is used for an apparatus including a coil and a conductor in a vicinity of the coil. The correction device corrects an influence of a magnetic field generated by the conductor when a current flows through the coil. The correction device includes a first measuring device, a second measuring device, and a control device. The first measuring device measures a first signal of the coil. The second measuring device measures a second signal of the coil, which is different from the first signal. The control device estimates the influence acting on the coil, based on a difference between the first signal filtered by a first filter and the second signal filtered by a second filter. Furthermore, the control device controls a command signal for flowing the current to the coil, based on an estimation result of the influence.

8 Claims, 17 Drawing Sheets

(51) Int. Cl.
  *G01R 33/56* (2006.01)
  *G05B 13/02* (2006.01)
  *H03F 1/00* (2006.01)

(56) References Cited

U.S. PATENT DOCUMENTS

| | | | |
|---|---|---|---|
| 5,227,728 A | 7/1993 | Kaufman et al. | |
| 5,237,277 A | 8/1993 | Lenz | |
| 5,451,877 A * | 9/1995 | Weissenberger | G01R 33/385 324/312 |
| 6,211,675 B1 * | 4/2001 | Ganin | G01R 33/56518 324/309 |
| 6,479,999 B1 * | 11/2002 | DeMeester | G01R 33/4215 324/309 |
| 6,538,443 B2 * | 3/2003 | Morich | G01R 33/385 324/309 |
| 6,850,066 B2 * | 2/2005 | Havens | G01R 33/3875 324/318 |
| 7,208,952 B2 * | 4/2007 | Dietz | G01R 33/3854 324/318 |
| 8,080,997 B2 * | 12/2011 | Kassai | G01R 33/56518 324/307 |
| 8,890,530 B2 | 11/2014 | Umeda et al. | |
| 2004/0227511 A1 * | 11/2004 | Havens | G01R 33/3875 324/309 |
| 2005/0030027 A1 * | 2/2005 | Dietz | G01R 33/3854 324/318 |
| 2011/0200243 A1 | 8/2011 | Takizawa et al. | |
| 2014/0232393 A1 * | 8/2014 | Wheaton | G01R 33/24 324/309 |
| 2017/0076043 A1 * | 3/2017 | Dormer | G06F 21/6254 |
| 2018/0256042 A1 * | 9/2018 | Beckers | G16H 30/40 |

FOREIGN PATENT DOCUMENTS

| | | |
|---|---|---|
| JP | 2012-40362 | 3/2012 |
| JP | 2014-45775 | 3/2014 |
| WO | WO 01/38893 A2 | 5/2001 |

* cited by examiner

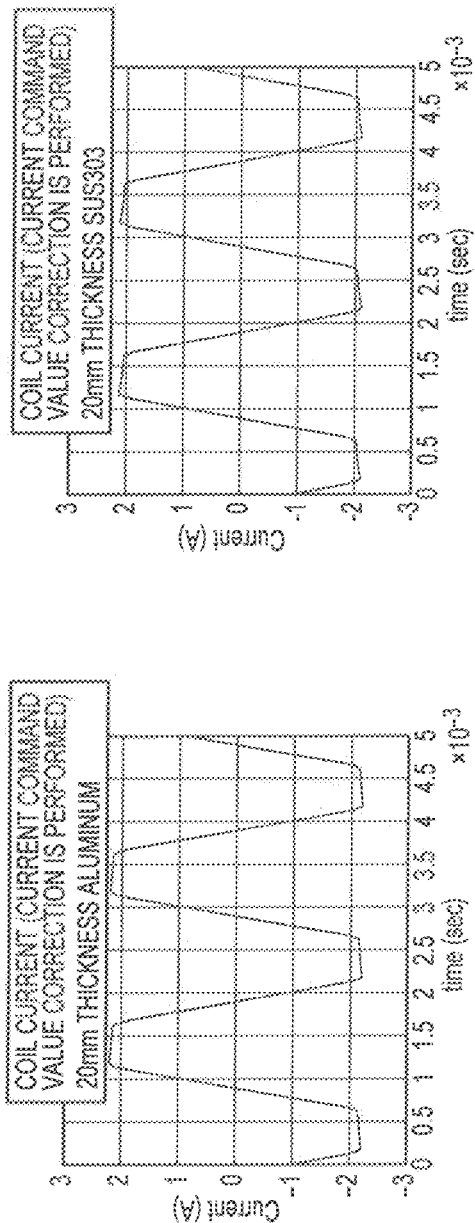
FIG. 15A
FIG. 15B
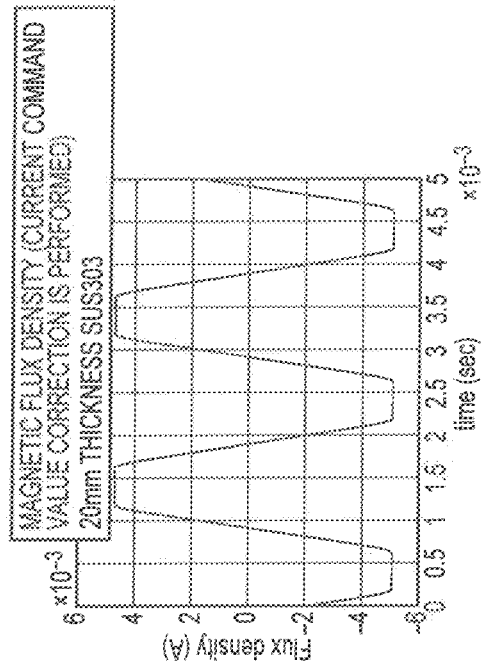
FIG. 15C
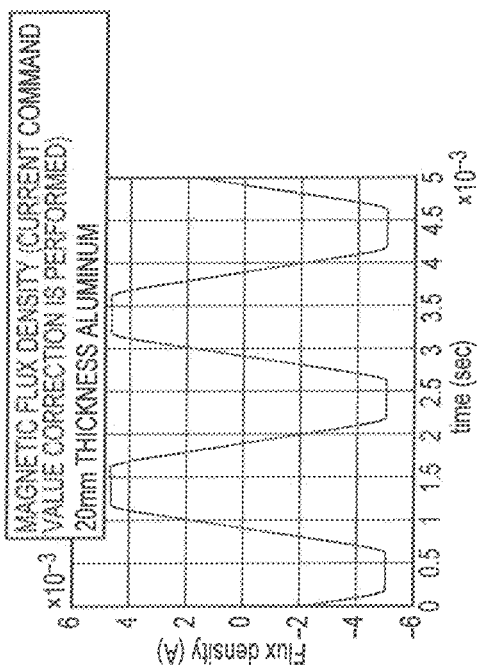
FIG. 15D

CORRECTION DEVICE, CORRECTION METHOD, AND MAGNETIC RESONANCE IMAGING APPARATUS

CROSS-REFERENCE TO RELATED APPLICATION

This application is based upon and claims the benefit of priority from Japanese Patent Application No. 2016-200198, filed on Oct. 11, 2016; the entire contents of which are incorporated herein by reference.

FIELD

Embodiments described herein relate generally to a correction device, a correction method, and a magnetic resonance imaging apparatus.

BACKGROUND

In a magnetic resonance imaging (MRI) apparatus, a gradient magnetic field (magnetic field having a different magnetic field strength depending on the position) is provided for each of three axes, namely, X-, Y-, and Z-axes of the human body for the purpose of designating desired cross-sectional position to be imaged and obtaining position information within the cross-section. As efforts to improve image quality of the MRI apparatus, enhancement of the magnetic field strength of the gradient magnetic field and pulsed high-speed driving of the gradient magnetic field are performed. For these purposes, a current of several hundred amperes (A) at several hundred Hz is supplied to a coil that generates the gradient magnetic field. Such a high-speed temporal magnetic field change generates eddy currents in a conductor near the coil. The eddy currents distort the gradient magnetic field and lead to deterioration of image quality.

There is a need to perform current control for correcting magnetic field distortion due to eddy currents in order to prevent deterioration of image quality. For example, conventional correction methods include a method for disposing a correction coil (to correct the magnetic field leaking from the gradient magnetic field coil) at outside of the gradient magnetic field coil and for correction the influence due to the eddy currents by temporally changing the current flowing through the correction coil. This method, however, would increase the cost since the correction coil needs to be newly disposed, and would produce a need to change the current in the correction coil in response to a temperature change in the conductor that generates eddy currents.

Moreover, there is another method for correction using a fixed filter having an appropriate time constant designed by measuring a nuclear magnetic resonance (NMR) signal when the current in the gradient magnetic field coil is changed stepwise to zero with a phantom positioned in the MRI at installation. However, this method using the fixed filter has difficulty in perfectly correcting the magnetic field distortion due to eddy currents.

BRIEF DESCRIPTION OF THE DRAWINGS

FIGS. 15A~15D are diagrams illustrating measurement results in the case where eddy current correction by the correction device according to the present embodiment is performed onto the case in FIG. 14.

DETAILED DESCRIPTION

Figure 1:
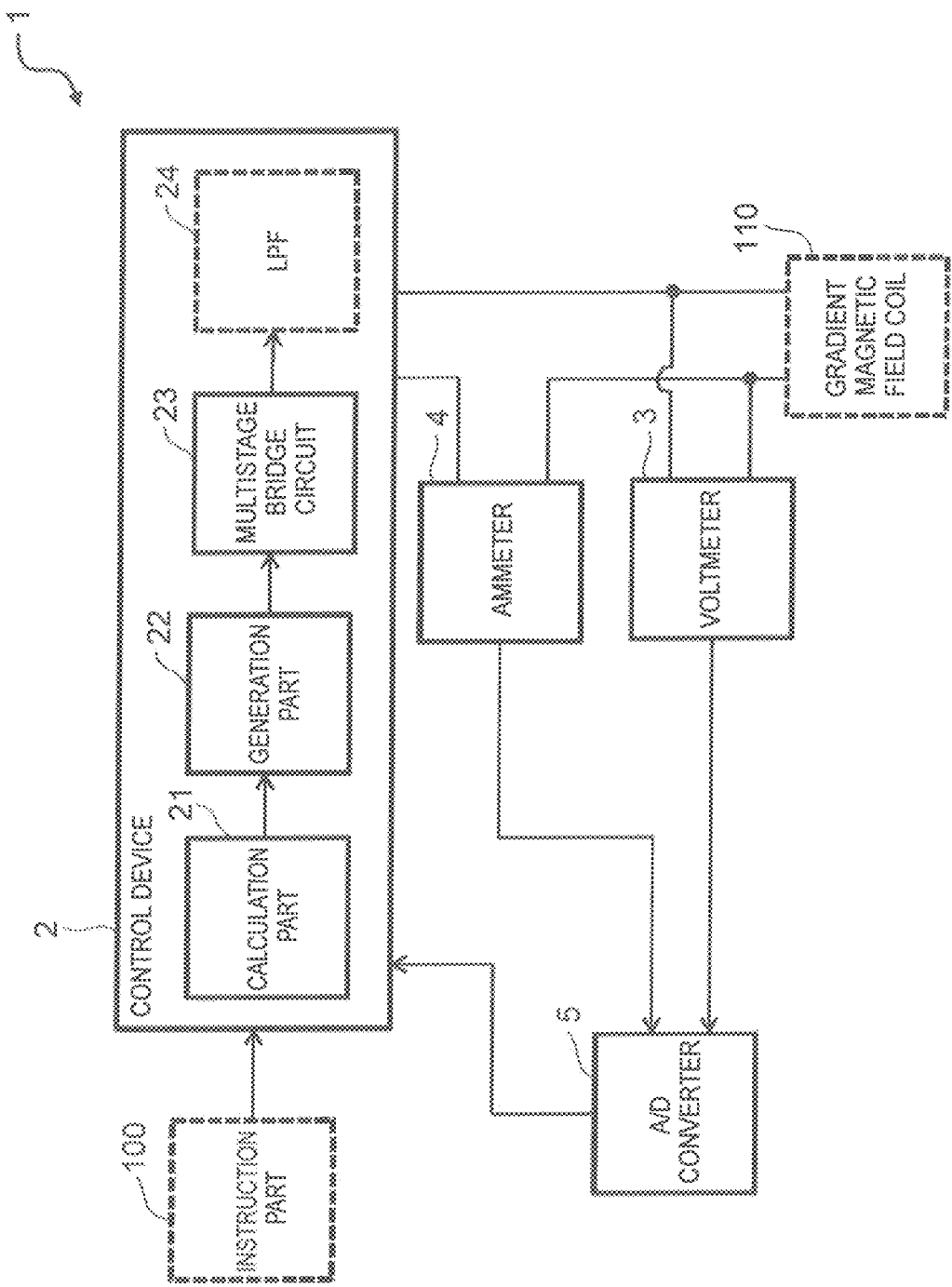
FIG. 1 is a diagram illustrating one example of a correction device according to a first embodiment.

According to one embodiment, a correction device is used for an apparatus including a coil and a conductor in a vicinity of the coil. The correction device corrects an influence of a magnetic field generated by the conductor when a current flows through the coil. The correction device includes a first measuring device, a second measuring device, and a control device. The first measuring device measures a first signal of the coil. The second measuring device measures a second signal of the coil, which is different from the first signal. The control device estimates the influence of the magnetic field acting on the coil, based on a difference between the first signal filtered by a first filter and the second signal filtered by a second filter. Furthermore, the control device controls a command signal for flowing the current to the coil, based on an estimation result of the influence of the magnetic field.

Hereinafter, a correction device according to an embodiment will be described with reference to the drawings. Components with the same reference numerals indicate similar components. The drawings are schematic or conceptual, and thus, the relationship between the thickness and the width of each of portions, the ratio coefficient of the size between the portions, or the like, are not necessarily the same as the actual case. Moreover, even in the case of representing the same portion, there may be cases in which the dimensions and ratio coefficients of the portions are different between individual drawings.

(First Embodiment)

The first embodiment will be described with reference to FIGS. 1 to 5.

FIG. 1 is a diagram illustrating a correction device 1 according to the first embodiment. The correction device 1 is applied to an apparatus having a coil and a conductor in the vicinity of the coil. An example of this is an apparatus such as a magnetic resonance imaging (MRI) apparatus including a gradient magnetic field coil and a conductor plate (also referred to as a conductor) in the vicinity the coil. In the MRI apparatus, when a current is supplied to the gradient magnetic field coil, eddy currents are generated in the conductor plate. Since the magnetic field generated by the eddy currents influences the magnetic field generated by the gradient magnetic field coil, the correction device 1 is configured to correct a current command value by estimating the influence of the eddy currents generated in the gradient magnetic field coil.

As illustrated in FIG. 1, the correction device 1 according to the first embodiment includes an instruction part 100, a control device 2, and a gradient magnetic field coil 110. The instruction part 100 instructs a target current command value. The control device 2 estimates the influence of the eddy currents from a voltage signal and a currant signal of the gradient magnetic field coil 110, creates a control command signal that is feedback-controlled with respect to a target current command value supplied from the instruction part 100, and outputs a pulse width modulation (PWM) signal baaed on the control command signal.

In order to estimate the influence of the eddy currents, there are provided a voltmeter 3 (voltage sensor) that measures a voltage signal (also referred to as a first signal) at the coil ends of the gradient magnetic field coil 110, an ammeter 4 (current sensor) that measures a current signal (also referred to as a second signal), and an A/D converter 5 that performs A/D conversion of the measured voltage signal and the measured currant signal and feeds back the result to the control device 2.

The instruction part 100 creates a command value by calculating encoder information, or the like. In this embodiment, the command value is supplied as a current value. The instruction part 100 corresponds to a digital signal processor (DSP) or a central processing unit (CPU) of a computer. The command value is not limited to the current value but may be a voltage value, or the like. The command value is also referred to as a command signal, and the voltage value and the current value are also referred to as a voltage signal and a current signal, respectively. Moreover, the instruction part 100 need not be included within the correction device 1 according to the present embodiment, and may perform input from the outside.

The control device 2 includes a calculation part 21, a generation part 22, a multistage bridge circuit 23, and a low pass filter (LPF) 24. The control device 2 creates a control command signal from which the influence of the eddy currents is removed from the current command value input by the instruction part 100, and outputs a PWM signal based on the control command signal.

The calculation part 21 estimates the influence of the eddy currents on the basis of the signal measured by the voltmeter 3 and the ammeter 4, and creates a control command signal. An example of the calculation part 21 includes a microprocessor, a micro control unit (MCU), and a CPU.

The generation part 22 generate a gate signal for controlling on-off of a switching element on the basis of the control command signal and a carrier signal (carrier wave). The carrier signal is a reference signal that is not modulated. Modulation is to change the carrier signal in order to transmit a signal. Methods for changing the carrier wave include frequency modulation of changing the frequency, amplitude modulation of changing the amplitude, and phase modulation of changing the phase. The carrier signal (carrier wave) is expressed as a triangular wave or a sawtooth wave and supplied by an externally provided oscillator (not illustrated), or the like. The generation part 22 compares the carrier signal with the control command signal and thereby generates a gate signal in which "1" is output in the case where the carrier signal is higher than the control command signal and "0" signal is output in the case where the carrier signal is lower than the control command signal, for example. On-off control of the switching element is controlled by the signals of "0" and "1". For example, the switching element is turned off in the case where the gate signal is "0" and the switching element is turned on in the case where the gate signal is "1". The comparison between the carrier signal and the control command signal is performed by a comparator (not illustrated), or the like, of the generation part 22.

The multistage bridge circuit 23 is a circuit, for example, in which a plurality of inverter circuits each having a bridge circuit is connected in series. The bridge circuit has a plurality of switching elements, and a freewheeling diode is connected in parallel to each of the switching elements. In the case of using a semiconductor device such as an insulated gate bipolar transistor (IGBT) as a switching element, current can flow only in the forward direction, and therefore, a freewheeling diode is connected to each of the elements in parallel so as to allow the current to flow in the backward direction. In addition to the IGBT, a metal-oxide semiconductor field effect transistor (MOSFET) may be used as the switching element. Incorporating the freewheeling diode, the MOSFET has a characteristic of a freewheeling diode. The multistage bridge circuit 23 is connected to a power source and operates each of the switching elements on the basis of the gate signal, thereby outputting a PWM signal.

The LPF 24 is connected to the multistage bridge circuit 23. The LPF 24 is formed with two capacitors (C) and two coils (L). The configuration of the LPF 24 is not limited to this, and may be formed with a circuit having a capacitor (C) and a resistor (R), or a circuit having a coil (L), a capacitor (C), and a resistor (R). Moreover, it may be formed with a single capacitor (C) and a single coil (L). While the control device 2 is described herein as a configuration including the LPF 24, there is no need to include the LPF 24 in the configuration, and there may be cases without the LPF 24.

The voltmeter 3 (voltage sensor) measures the voltage signal across coil ends of the gradient magnetic field coil 110. The ammeter 4 (current sensor) measures the current signal of the gradient magnetic field coil 110. The current measurement mainly uses the current sensor, in which, for example, an electric wire to be measured is wound around a soft magnetic core, leading to generation of inductance by winding of the electric wire. The voltage signal across the coil ends of the gradient magnetic field coil 110 is preferably measured at a portion between the current sensor and the gradient magnetic field coil 110 such that the inductance does not influence the voltage signal.

The current signal and the voltage signal respectively measured by the voltmeter 3 and the ammeter 4 are converted by the A/D converter 5 and output to the control device 2.

The gradient magnetic field coil 110 is, for example, used for an MRI apparatus, and a coil for generating a gradient magnetic field. By this gradient magnetic field coil 110, a spatially linear magnetic field is generated. There is no need to include the gradient magnetic field coil 110 within the correction device 1 according to the present embodiment. The gradient magnetic field coil 110 is not limited to a coil that creates a gradient magnetic field, but also includes a coil used for a rotating electrical machine, or the like.

Next, a method for estimating the eddy currents by the correction device 1 according to the present embodiment will be described in detail.

Estimation of the eddy currents of the correction device 1 is performed by the calculation part 21 in the control device 2.

Figure 2:
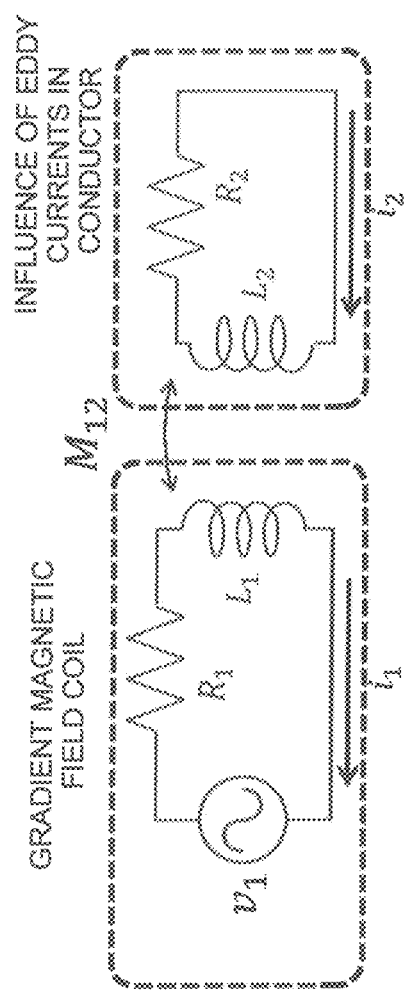
FIG. 2 is a diagram illustrating a linear model of a gradient magnetic field coil and a conductor in view of the influence of eddy currents.

FIG. 2 is a diagram illustrating a linear model of a gradient magnetic field coil and a conductor in view of the influence of eddy currents. As illustrated in FIG. 2, the gradient magnetic field coil in view of the influence of eddy currents is represented by a simple linear model of a transformer with a leakage magnetic flux. Moreover, the influence of the eddy currents of the conductor located in the neighborhood of the gradient magnetic field coil is expressed by inductance and resistance. The conductor is a metal plate, or the like, and corresponds to a material such as aluminum or SUS 300 series. Each of $L_1$, $R_1$, and $i_1$ respectively represents inductance, resistance, and the current of the gradient magnetic field coil. Each of $L_2$, $R_2$, and $i_2$ respectively indicates inductance, resistance, and eddy currents of the conductor. The circuit equation of the model in FIG. 2 is expressed by the following formula (1).

$$G_1 = \begin{cases} v_1 = L_1 \frac{di_1}{dt} + R_1 i_1 + M_{12} \frac{di_2}{dt} \\ 0 = L_2 \frac{di_2}{dt} + R_2 i_2 + M_{12} \frac{di_1}{dt} \end{cases} \quad (1)$$

The time constant of the eddy currents $i_2$ is adjusted by the inductance $L_2$ and the resistance $R_2$ of the conductor. Moreover, $M_{12}$ represents mutual inductance of the conductor and the gradient magnetic field coil, and can be expressed by the following formula (2) using a coupling coefficient $k_{12}$.

$$M_{12} = k_{12}\sqrt{L_1 L_2} \quad (2)$$

In the case where the value of the coupling coefficient $k_{12}$ is close to "1", the gradient magnetic field coil and the conductor are close to each other, leading to great influence of the eddy currents. In the case where the coupling coefficient $k_{12}$ close to "0", the gradient magnetic field coil and the conductor are separated from each other, leading to small influence of the eddy currents. For example, the magnetic flux in the MRI apparatus is expressed by the following formula (3) as the interlinkage magnetic flux $\Phi$ in the linear model.

$$\Phi_1 = L_1 i_1 + M_{12} i_2 \quad (3)$$

In the case where the gradient magnetic field coil and the conductor are separated from each other and the influence of eddy currents is small, a mutual inductance $M_{12}$ is approximately equal to "0". The interlinkage magnetic flux at this time is generated in proportion to the current flowing through the gradient magnetic field coil. In the case where the conductor is close to the gradient magnetic field coil and the influence of the eddy currents is great, then, $M_{12}$ is approximately equal to "1". The interlinkage magnetic flux at this time is not proportional to the coil current by the influence of the eddy currents.

Estimation of $M_{12} i_2$ to generate a desired interlinkage magnetic flux from formula (3) would enable estimation of the interlinkage magnetic flux $\Phi$ since an inductance $L_1$ is known and $i_1$ is measurable. An interlinkage magnetic flux proportional to the command value would be obtained by performing feedback control on the interlinkage magnetic flux $\Phi$ in the control device 2.

Next, the estimation of $M_{12} i_2$ in the control device 2 will be described in detail.

The following formula (4) is derived from the circuit equation in formula (1).

$$M_{12} \frac{di_2}{dt} = v_1 - \left( L_1 \frac{di_1}{dt} + R_1 i_1 \right) \quad (4)$$

As indicated by the formula (4), a voltage signal $v_1$ across the coil ends of the gradient magnetic field coil 110 and a coil current signal $i_1$ are measurable respectively by the voltmeter 3 and the ammeter 4. Since the inductance $L_1$ and a resistance $R_1$ are known, $M_{12} di_2/dt$ is estimated. $M_{12} i_2$ is obtained by integrating the estimated $M_{12} di_2/dt$.

Figure 3:
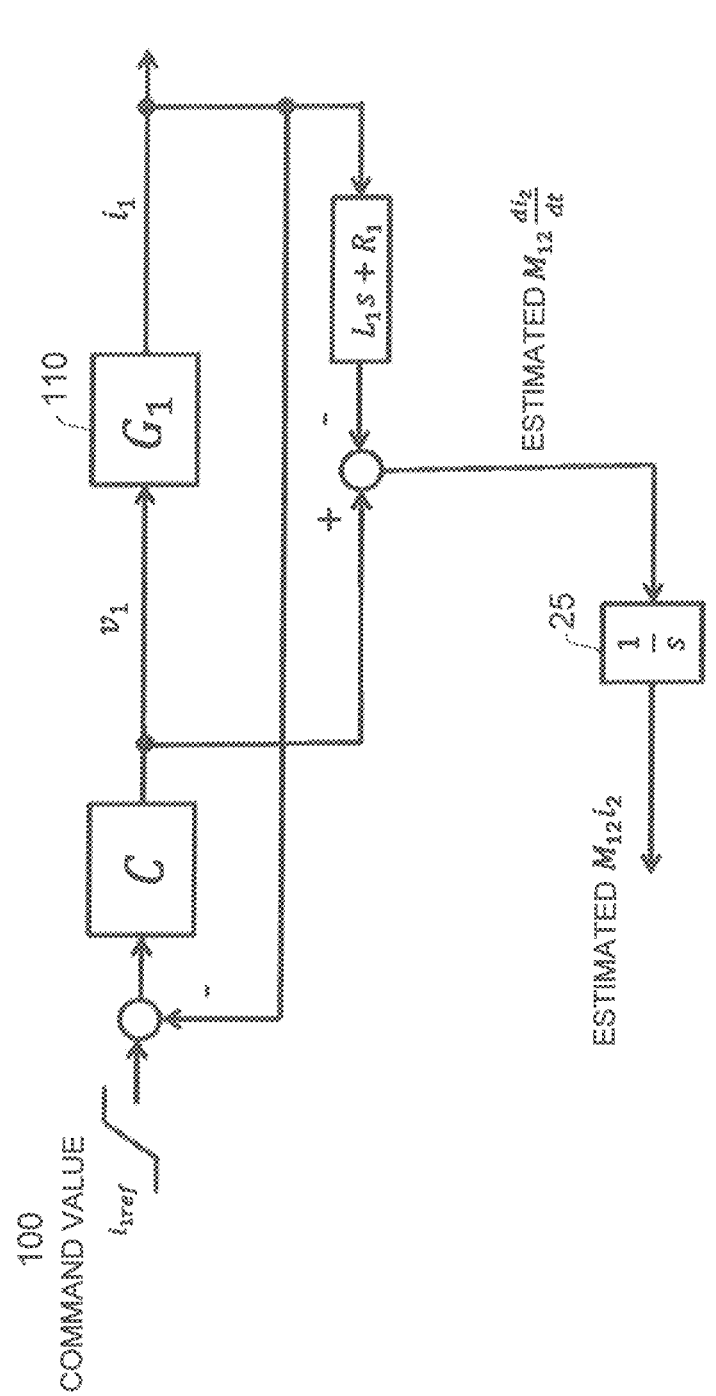
FIG. 3 is a block diagram illustrating one example of flow of estimation of $M_{12}i_2$.

FIG. 3 is a block diagram illustrating one example of estimation of $M_{12} i_2$. The voltmeter 3 for measuring a voltage signal and the ammeter 4 for measuring a current signal of a current flowing through the gradient magnetic field coil 110 are provided between the terminals of the gradient magnetic field coil 110. Moreover, there is provided a filter for filtering the current signal of the current flowing through the gradient magnetic field and an integrator 25 (integrating circuit) that obtains $M_{12} i_2$ by integrating $M_{12} di_2/dt$ estimated from data obtained by using the voltmeter 3, the ammeter 4, and the filter. C is a feedback controller. C includes functions of the generation part 22, the multistage bridge circuit 23 and the LPF 24, and outputs a PWM signal based on a control command signal (to be described below in FIG. 5). $G_1$ is the gradient magnetic field coil 110. Filtering is to reserve signals with a specific frequency band by removing signals other than the signals of the specific frequency band. For example, the frequency band may be set as a specific frequency and frequency width, or may be set to be not less than a specific frequency or not more than a specific frequency.

As illustrated in FIG. 3, a filter $(L_1 s + R_1)$ corresponds to the parenthesis on the right side of the formula (4). Although the current signal $i_1$ of the current flowing through the gradient magnetic field coil 110 is placed in the filter $(L_1 s + R_1)$ in order to estimate $M_{12} di_2/dt$, this filter cannot be realized because the order of the numerator is greater than the order of the denominator. Accordingly, the frequency band for estimating $M_{12} di_2/dt$ is limited.

Figure 4:
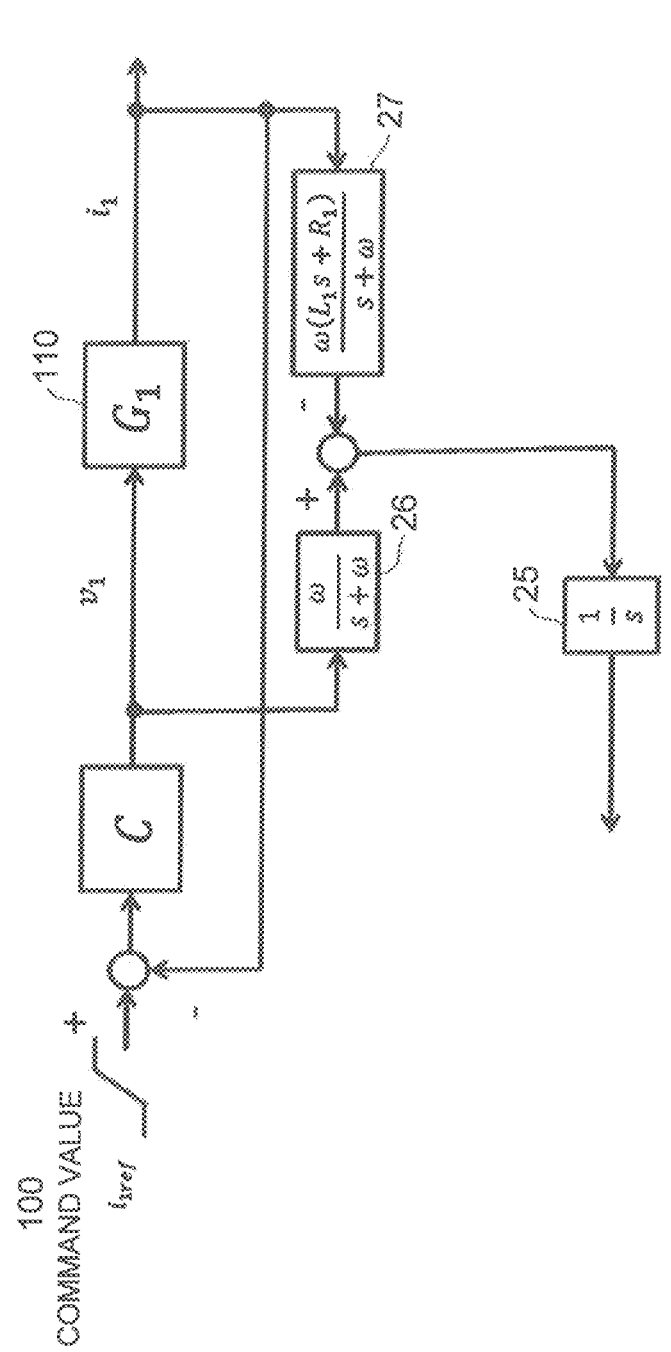
FIG. 4 is a block diagram illustrating one example of control configuration for limiting a frequency band.

FIG. 4 is a block diagram illustrating one example of control configuration for limiting a frequency band. A cutoff frequency $\omega$ of the filter that limits the frequency band is set higher than the frequency band of the command value. With this setting, the filter can be implemented in a control processor inside the MRI apparatus, for example. As illustrated in FIG. 4, the calculation part 21 includes $\omega/(s+\omega)$ as a low pass filter 26 that filters high frequency components and includes ω $(L_1 s+R_1)/(s+\omega)$ as a high pass filter 27 that filters low frequency components in order to limit the frequency band. The voltage signal $v_1$ at the coil ends of the gradient magnetic field coil 110 is filtered by the low pass filter 26. The current signal $i_1$ of the current flowing through the gradient magnetic field coil 110 is filtered by the high pass filter 27. $M_{12}$ (ω/(s+ω))·$di_2$/dt estimated from the difference between the filtered $v_1$ and $i_1$ is integrated by the integrator 25. With this operation, $M_{12}i_2$(ω/(s+ω)) is estimated. The current signal $i_1$ of the coil current flowing through the gradient magnetic field coil 110 is fed back to the current command value.

The current command value is corrected using the estimated $M_{12}i_2$(ω/(s+ω)).

Figure 5:
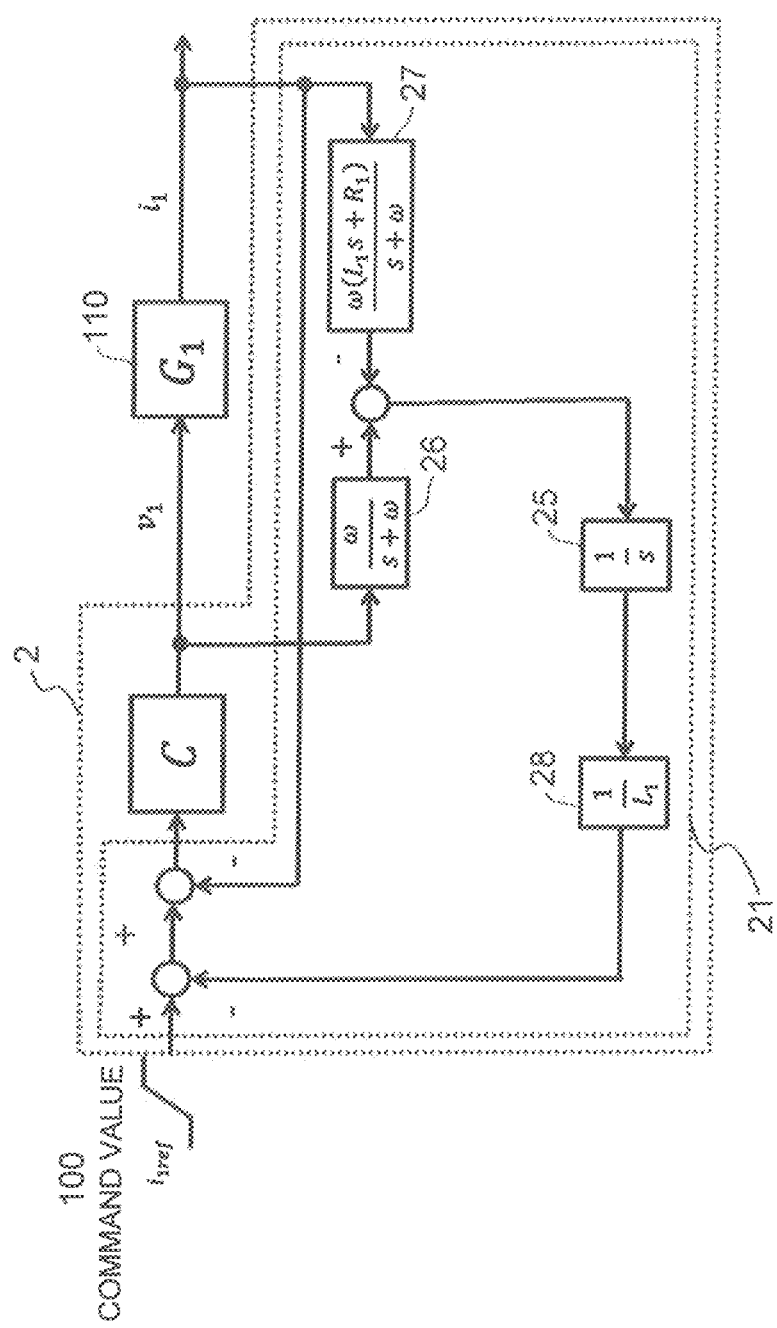
FIG. 5 is a block diagram illustrating one example of control configuration for correcting a current command value of a control device.

FIG. 5 is a block diagram illustrating one example of control configuration for correcting the current command value in the control device 2.

In FIG. 5, the current command value is corrected on-line by estimating the influence due to the eddy currents. The block diagram of FIG. 5 further includes a gain adjuster 28 for applying a gain to the output of the integrator 25, in addition to the configuration of FIG. 4. The gain adjuster 28 obtains a correction current obtained by multiplying the output of the integrator 25 with $1/L_1$. The eddy correction current (output from the gain adjuster 28) is fed back to the current command value. That is, a signal obtained by subtracting the eddy correction current and the current signal flowing through the gradient magnetic field coil 110 from the current command value is added to the current command value, and the control command signal is obtained. By measuring the coil end voltage and the current of the gradient, magnetic field coil 110, it is possible to perform timely estimation of the time constant of the eddy currants. The eddy current estimation calculation is performed by the calculation part 21 in the control device 2. Moreover, these estimation calculations may be performed not only by the calculation part 21 but also by the instruction part 100. Moreover, the calculation part 21 may be located outside the control device 2.

Figure 6:
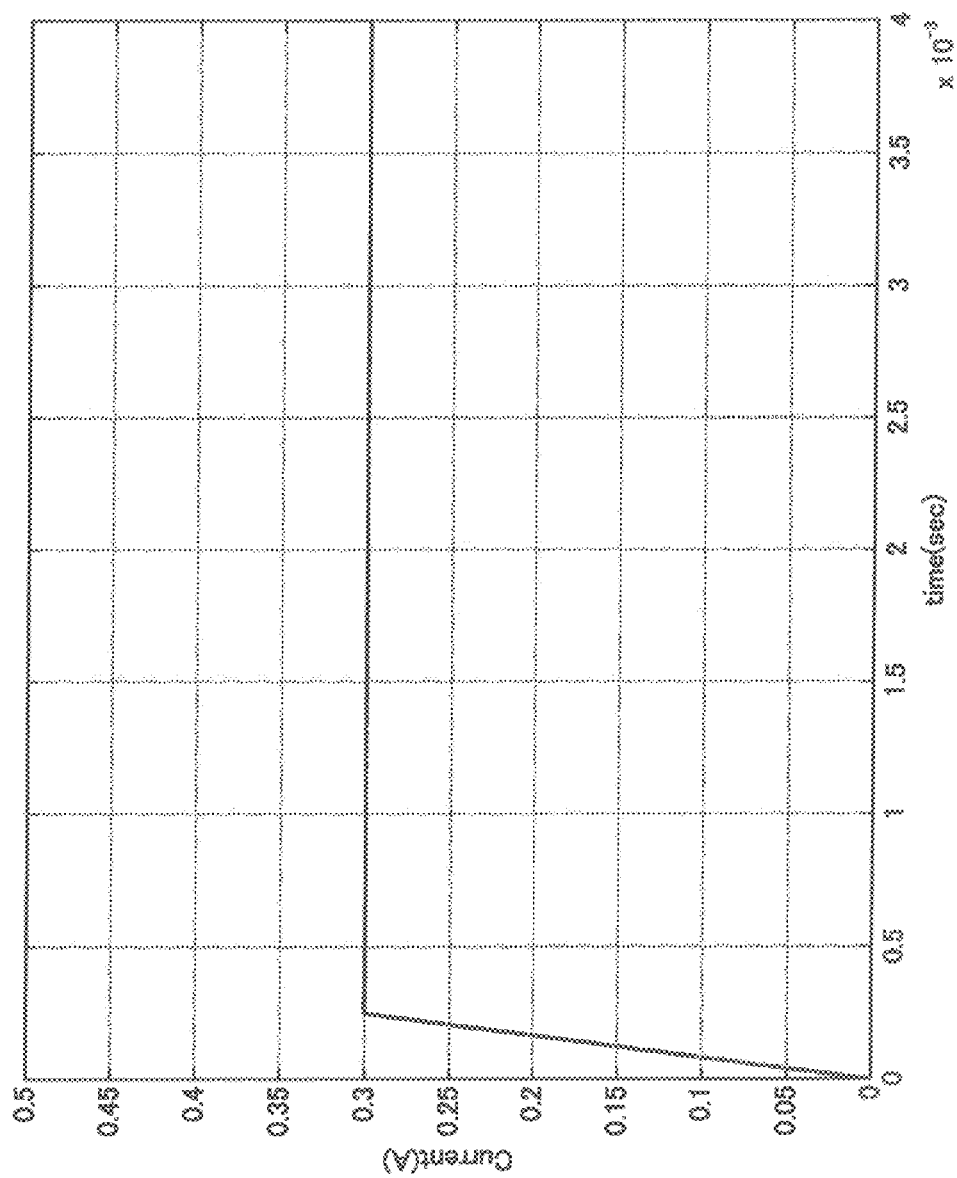
FIG. 6 is a diagram illustrating a comparison between a current command value and a current flowing through a gradient magnetic field coil.
Figure 7:
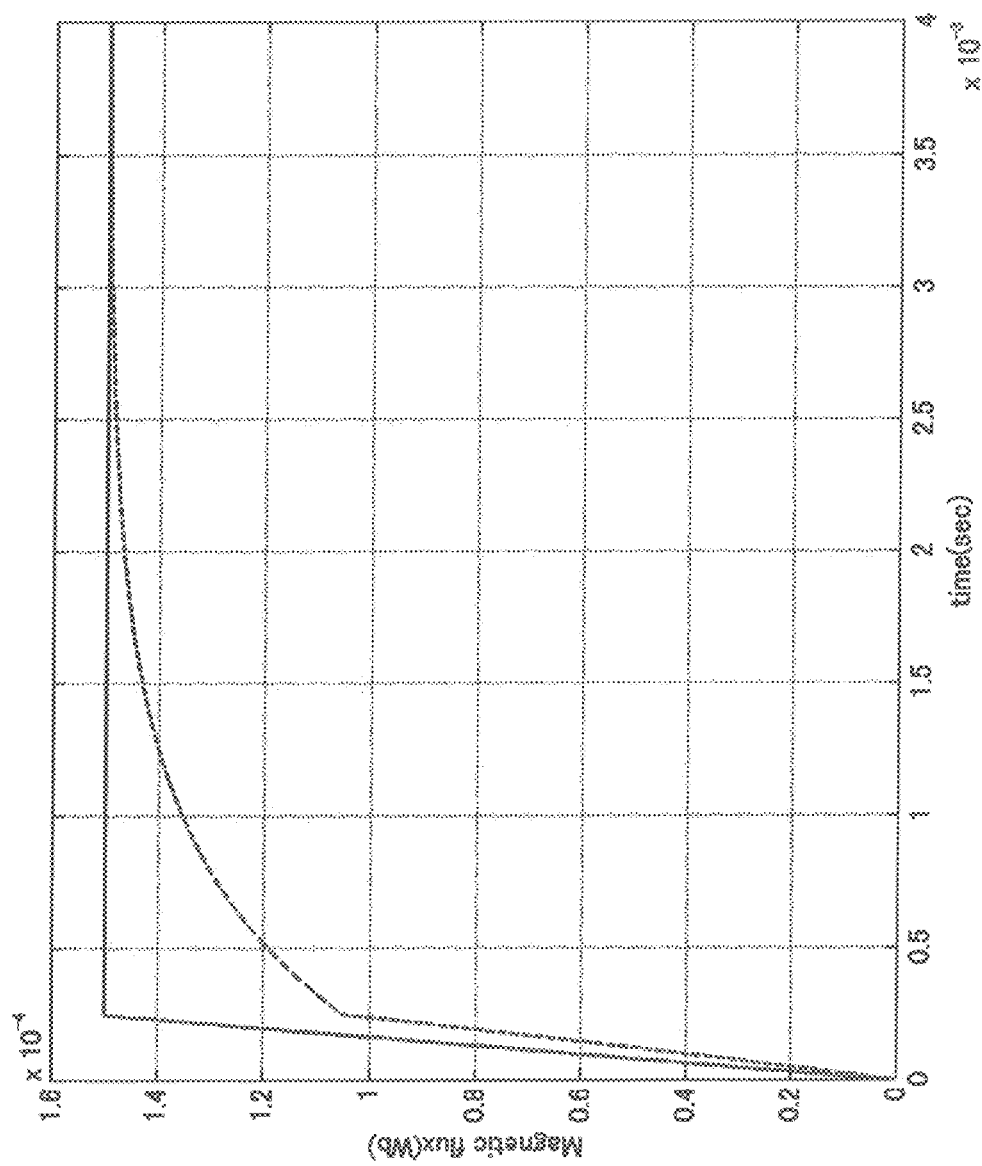
FIG. 7 is a diagram illustrating a comparison between a waveform obtained by applying a gain to a current command value and an in tar linkage magnetic flux.

Next, a result of simulation in the case where the current command value correction is performed by the correction device according to the present embodiment will be described. In the simulation, the interlinkage magnetic flux in the case where the correction illustrated in FIG. 5 was performed on the linear model (FIG. 2) of the gradient magnetic field coil in view of the influence of the eddy currants was calculated. Setting for parameters of the gradient magnetic field coil was performed such that inductance $L_1$=0.5×$10^{-3}$ H and resistance $R_1$=8.3Ω. Setting for parameters of the conductor was performed such that inductance $L_2$=0.5×$10^{-5}$ H resistance $R_2$=7.5×$10^{-3}$Ω, and coupling coefficient k=0.6. In the case where the gradient magnetic field coil current follows the current command value without correcting the current command value according to the present embodiment; a value obtained by applying a gain to the current command value and the calculation result of the interlinkage magnetic flux are illustrated in FIGS. 6 and 7. FIG. 6 is a diagram illustrating a comparison between the current command value and the gradient magnetic field coil current. The currant command value is indicated by a solid line, and the gradient magnetic field coil current is indicated by a broken line. The gradient magnetic field coil current closely follows the current command value. FIG. 7 is a diagram illustrating a comparison between a waveform obtained by applying a gain to the current command value, and an interlinkage magnetic flux. The waveform obtained by applying a gain to the current command value is indicated by the solid line, and the interlinkage magnetic flux is indicated by the broken line. It is observed that the interlinkage magnetic flux is greatly different from the currant command value due to the influence of the eddy currents. In this case, the desired gradient magnetic field cannot be generated due to the influence of eddy currents, leading to distortion of the MRI image.

Figure 8:
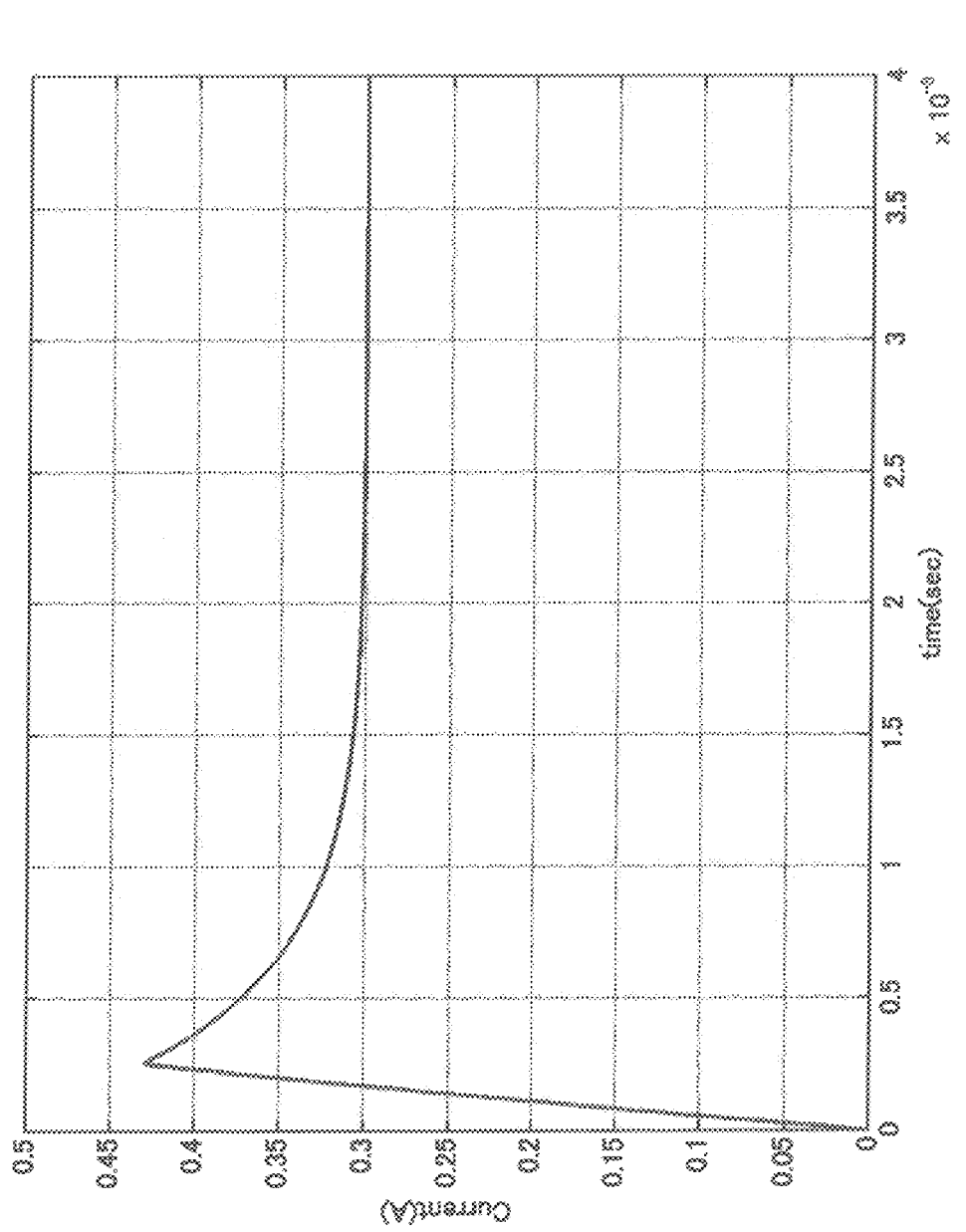
FIG. 8 is a diagram illustrating a comparison between a current command value and a current flowing through a gradient magnetic field coil in the case of estimating an influence of eddy currants according to the first embodiment.
Figure 9:
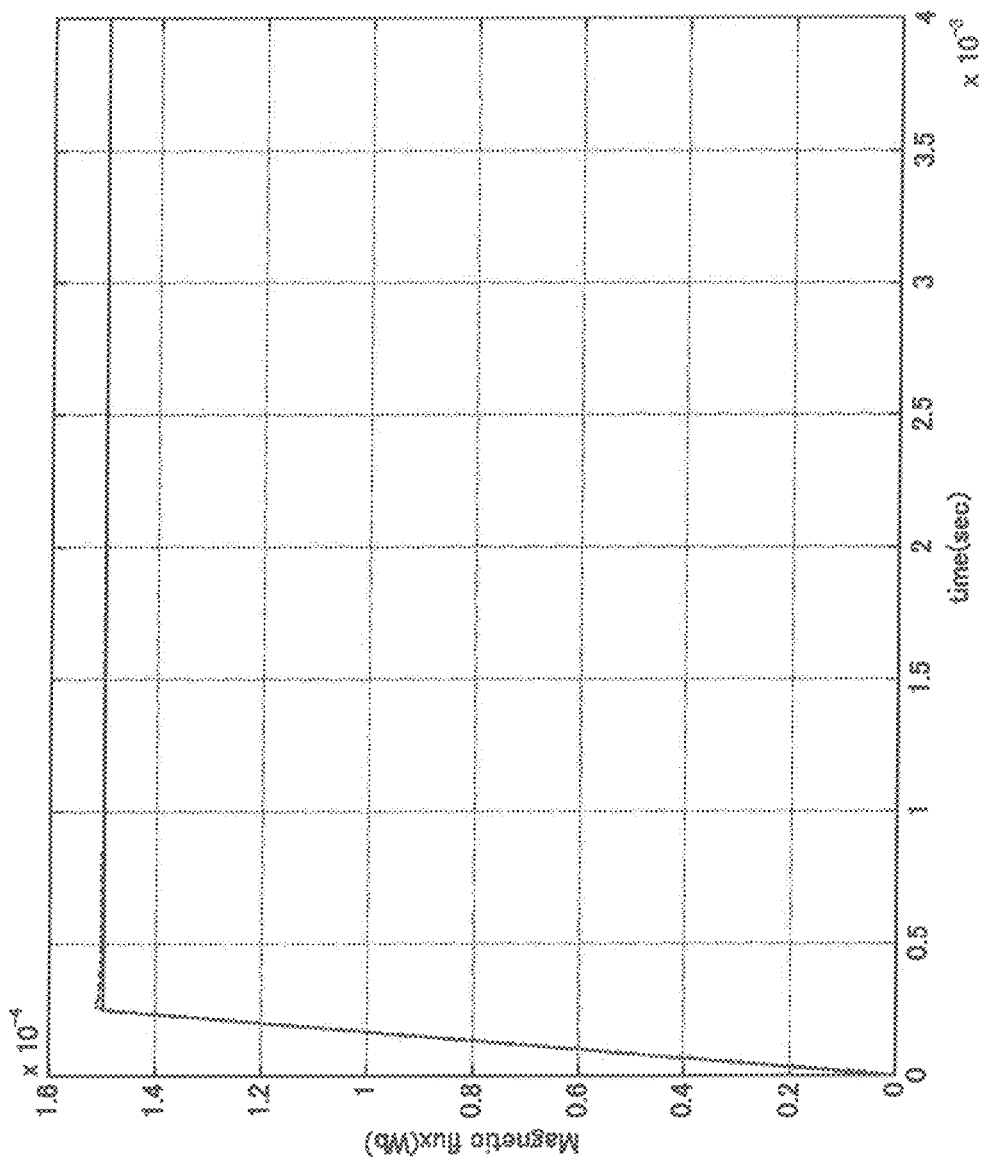
FIG. 9 is a diagram illustrating a comparison between a waveform obtained by applying a gain to a current command value and an interlinkage magnetic flux.

In comparison, results when the current command value is corrected by the correction device according to the present embodiment are illustrated in FIGS. 8 and 9. FIG. 8 is a diagram illustrating a comparison between the current command value and the gradient magnetic field coil current in the case where the influence of the eddy currents according to the present embodiment is estimated. The current command value is indicated by a solid line, and the gradient magnetic field coil current is indicated by a broken line. The current command value and the gradient magnetic field coil current closely follow with each other. FIG. 9 is a diagram illustrating a comparison between a waveform obtained by applying a gain to a current command value, and an interlinkage magnetic flux. The waveform obtained by applying a gain to the current command value is indicated by the solid line, and the interlinkage magnetic flux is indicated by the broken line. The interlinkage magnetic flux has a waveform proportional to the current command value before correction, and it can be observed that the influence of the eddy currents is successfully eliminated from the interlinkage magnetic flux as compared with FIG. 7. By correcting the target current command value supplied from the instruction part with estimation of the influence of the eddy currents, and by inputting the corrected signal into the control device 2, it is possible to effectively eliminate the influence of the magnetic field generated by the eddy currents and to obtain an interlinkage magnetic flux proportional to the target current command value.

Figure 10A:
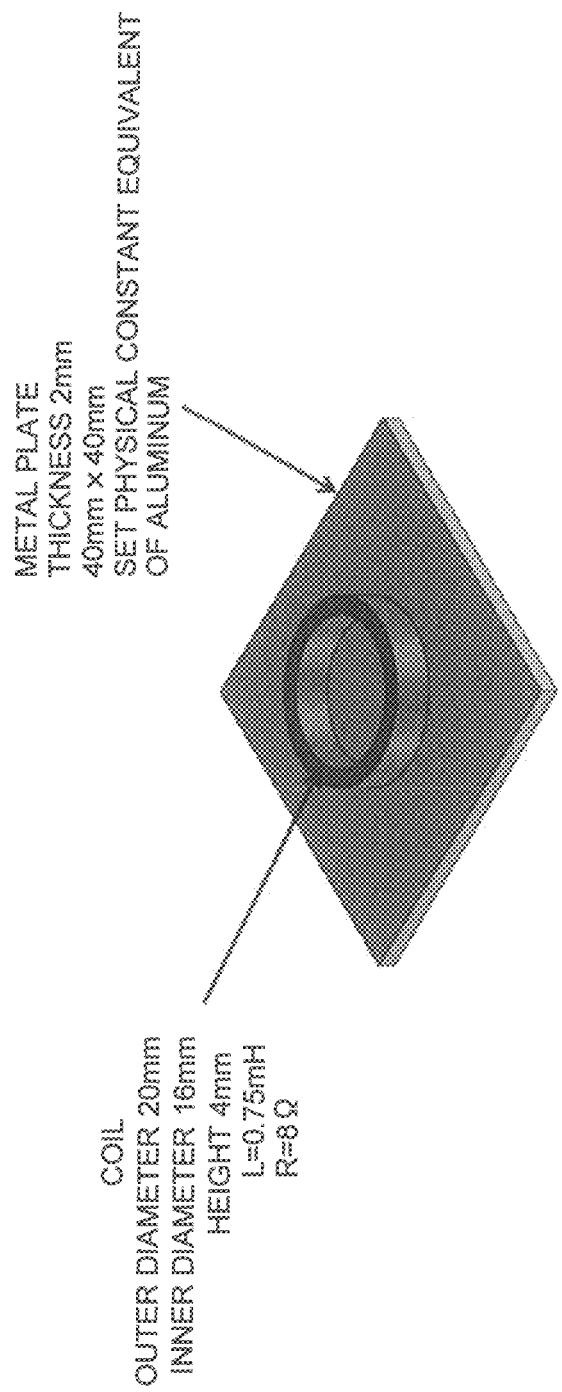
FIGS. 10A~10B are diagrams illustrating a model created by using a magnetic field analysis technique.
Figure 10B:
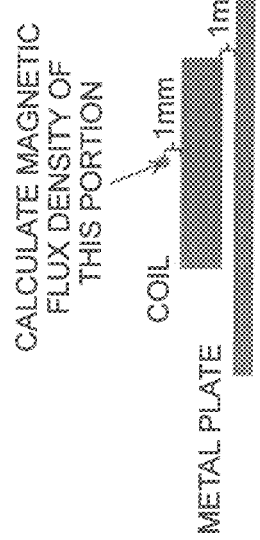

Next, a result of simulation using a magnetic field analysis technique will be described. FIGS. 10A and 10B are diagrams illustrating a model created using a magnetic field analysis technique. As illustrated in FIG. 10A, the coil has an annular shape with outer diameter of 20 mm, inner diameter of 16 mm, and height of 4 mm, with inductance L=0.75 mH and resistance R=8Ω. For the conductor, a metal plate having outer shape of 40 mm×40 mm×2 mm is used. The material of the metal plate was equivalent of aluminum. As illustrated in FIG. 10B, the distance between the coil and the conductor was set to 1 mm, and the magnetic flux density at the position 1 mm from a surface opposite to a surface of the coil facing the conductor was calculated. A current command value similar to echo planar imaging (EPI) sequence in which the gradient magnetic field is frequently switched in the MRI apparatus was supplied to this model.

Figure 11:
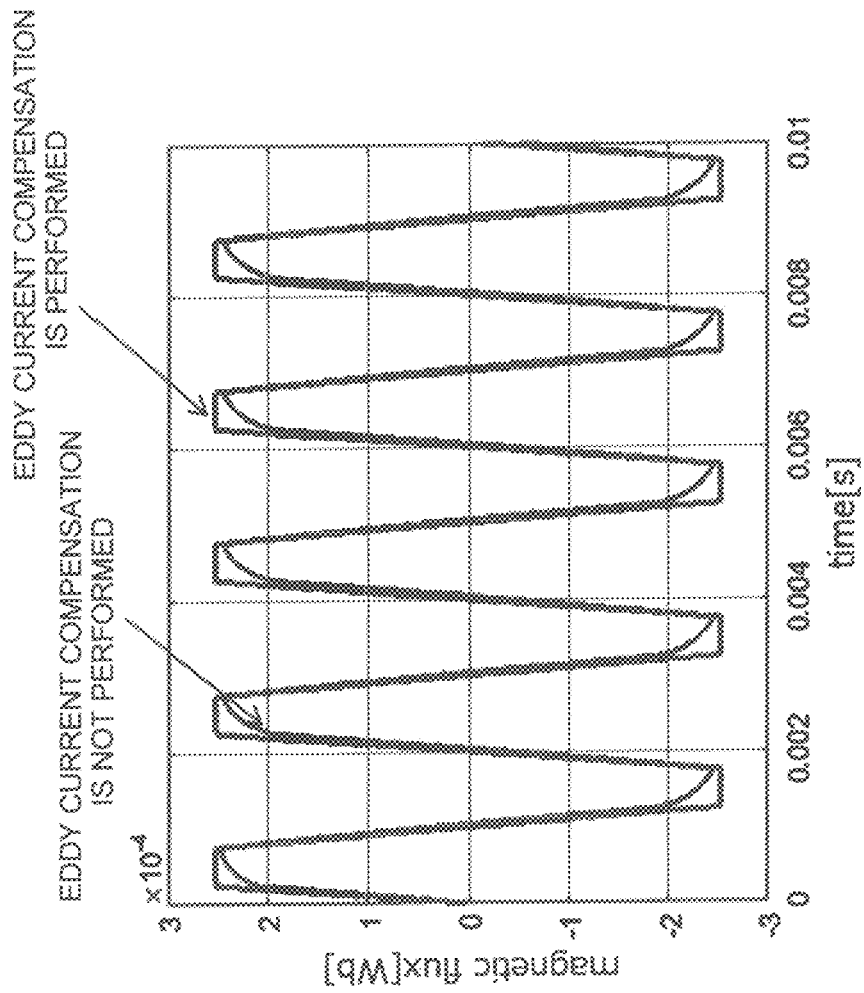
FIG. 11 is a diagram illustrating a comparison of calculation results of magnetic flux density in the case where eddy current correction is performed and the case where eddy current correction is not performed.

FIG. 11 is a diagram illustrating a comparison of calculation results of magnetic flux density in the case where the eddy current correction is performed and in the case where the eddy current correction is not performed. In the case where the eddy current correction is not performed, the waveform became a dull waveform due to the influence of the eddy current. In comparison, in the case where the eddy current correction is performed, a fine trapezoidal wave is obtained.

Next, measurement results by an experimental apparatus simulating the correction device according to the present embodiment will be described.

Figure 12:
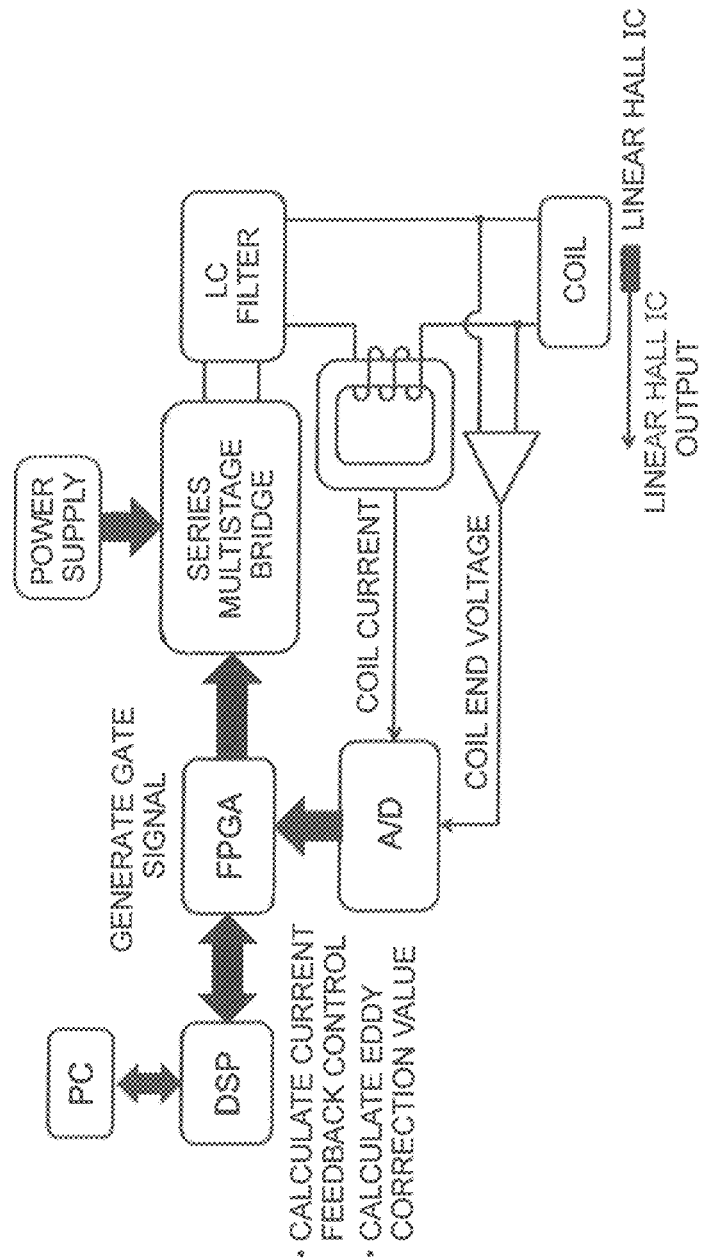
FIG. 12 is a diagram illustrating one example of configuration of an experimental apparatus.

FIG. 12 is a diagram illustrating one example of configuration of the experimental apparatus. As illustrated in FIG. 12, the voltage applied to the gradient magnetic field coil drives a series multistage bridge circuit and outputs a PWM signal. The current signal of the current flowing through the gradient magnetic field coil and the voltage signal across the coil ends of the gradient magnetic field coil are A/D converted and fed back to the DSP, and then, the current feedback control and the calculation of an eddy current correction value are performed. At this time, a current sensor is used in observing the currant signal of the gradient magnetic field coil, and the cable wound around the currant sensor generates an inductance. The voltage across the coil ends of the gradient magnetic field coil is measured at a portion between the current sensor and the coil so as not to allow the inductance due to cable winding to the sensor to influence the current signal and the voltage signal. Moreover, a linear Hall effect IC was installed under the coil in order to observe the generated magnetic flux density. The parameters of the gradient magnetic field coil used in the experiment were such that inductance $L_1$=0.74 mH, resistance $R_1$=0.13 Ω, and wire diameter=2 mm. Moreover, the coil used in the experimental apparatus is one simulating the gradient magnetic field coil.

As the current command value, a traperoidal waveform with amplitude±2A simulating EPI was applied to the control device 2. For the resistance $R_1$ and the inductance $L_1$ of the gradient magnetic field coil used for filter setting in estimating $M_{12}di_2/dt$, the values at the low frequency measured beforehand by an impedance analyzer may be used.

Figure 13:
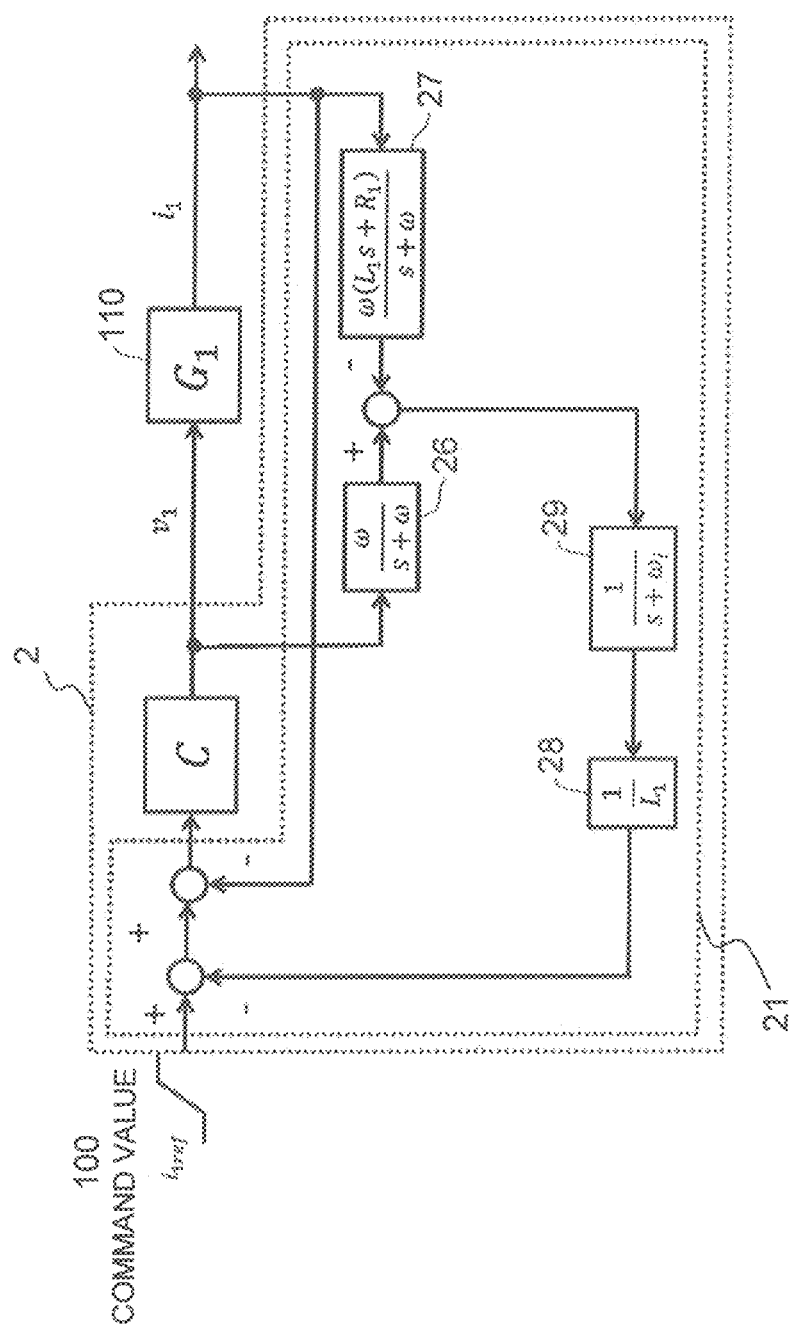
FIG. 13 is a block diagram illustrating one example of control configuration for correcting the current command value used in the experimental apparatus.
Figure 14B:
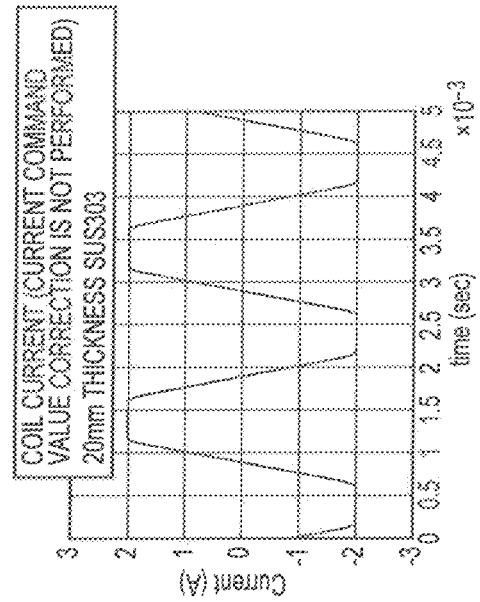
FIGS. 14A~14D are diagrams illustrating measurement results of magnetic flux density and gradient magnetic field coil current when an aluminum plate or SUS303 plate (thickness 20 mm) is placed above the gradient magnetic field coil.
Figure 14A:
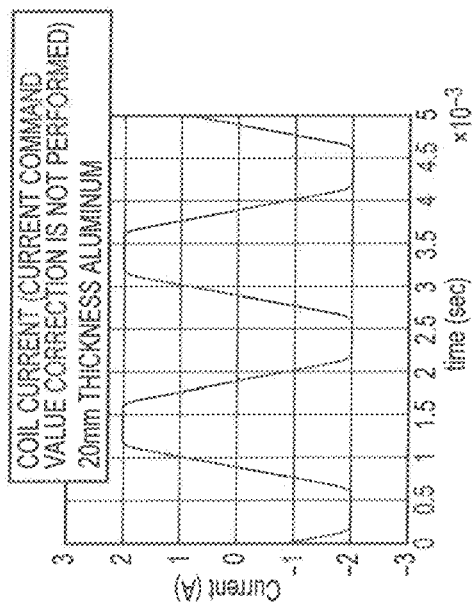
Figure 14D:
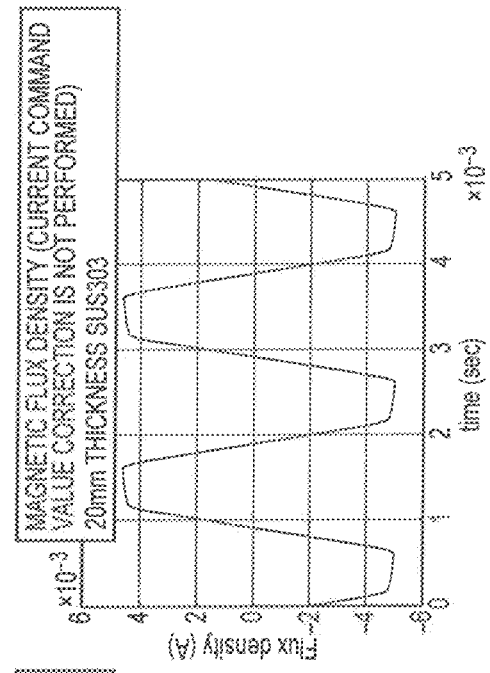
Figure 14C:
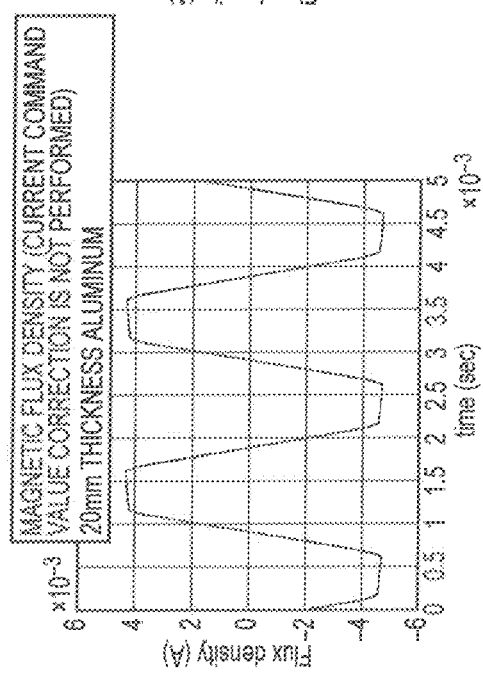

FIG. 13 is a block diagram illustrating one example of control configuration for correcting the current command value used in the experimental apparatus.

In comparison with FIG. 5, the integrator 29 is changed to $1/(s+\omega_i)$. Calculation of eddy current correction is performed at a control cycle shorter than the control period of the control device 2. With this configuration, a phase delay due to discretization of the low pass filter 26, the high pass filter 27, and the integrator 29 is minimized. Moreover, there is a possibility of occurrence of drift in an eddy current correction value in the integrator 25 illustrated in FIG. 5 due to noise, a gain error, an offset, or the like, of the current sensor and the voltage sensor. To cope with this, the experimental apparatus has changed the integrator 25 to a low pass filter having a cutoff frequency $\omega_i$ in an extremely low frequency region of several Hz, thereby preventing the drift in the eddy current correction value by avoiding providing integration characteristic in the low frequency region.

FIGS. 14A~14D are diagrams illustrating measurement results of the magnetic flew density and the gradient magnetic field coil current in the case where an aluminum plate or a SUS303 plate (thickness 20 mm) is placed above the gradient magnetic field coil. From the measurement results, it is observed that, even if the gradient magnetic field coil current is made to follow the current command value of the trapezoidal waveform, the generated magnetic flux density is not proportional to the current flowing through the gradient magnetic field coil due to the influence of the eddy currents generated in the conductor placed above the coil.

FIGS. 15A~15D are diagrams illustrating a measurement result in the case where eddy current correction by the correction device according to the present embodiment was performed onto the gradient magnetic field coil in FIGS. 14A~14D. The eddy current correction value is estimated on the basis of the current signal of the gradient magnetic field coil and the voltage signal across the coil ends of the gradient magnetic field coil, and the current command value is corrected by feeding back the estimation result. From this result, it is observed that the magnetic flux density changes in a trapezoidal wave. Moreover, it is observed that the generated magnetic flux density is proportional to the current flowing through the gradient magnetic field coil.

According to the correction device of the present embodiment, the influence of the magnetic field distortion due to eddy currents can be reduced by estimating the influence of the eddy currents and by correcting the current command value input into the control device. Moreover, it is possible to correct the current command value in accordance with the change in the time constant of the eddy currents. Moreover, in the case of being applied in an MRI apparatus, there is no need to place a phantom in filter setting in MRI installation. Moreover, even if there is a change of a temperature characteristic of the conductor in which the eddy currents occurs in the MRI apparatus, it is possible to correct the influence on the gradient magnetic field due to eddy currents.

(Second Embodiment)

The second embodiment will be described with reference to FIG. 16.

Figure 16:
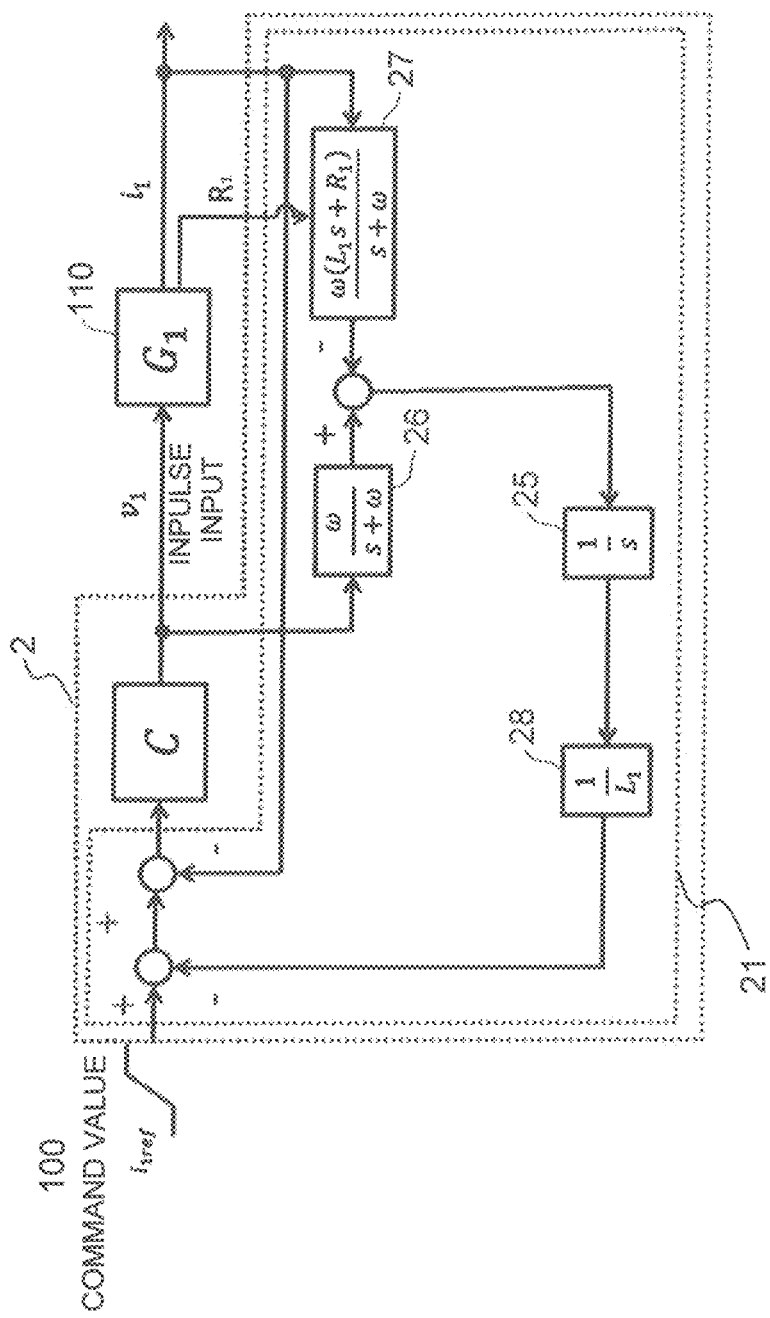
FIG. 16 is a diagram illustrating one example of a correction device according to a second embodiment.

FIG. 16 is a diagram illustrating a correction device according to the second embodiment. In order to identify the resistance $R_1$ of the gradient magnetic field coil 110, the correction device 1 according to the present embodiment inputs an impulse-like signal into the gradient magnetic field coil 110 and identifies the resistance $R_1$ from an impulse response from the coil. By applying the resistance value $R_1$ to $\omega$ $(L_1s+R_1)/(s+\omega)$ which is the high pass filter 27, it is possible to perform estimation of the eddy currents while timely identifying the resistance value $R_1$. The impulse-like signal is a signal having a near-zero time width and having a value at a certain moment.

The impulse input into the gradient magnetic field coil 110 is performed by inputting a gate signal (previously stored in a storage (not illustrated)) for generating an impulse signal into the multistage bridge circuit 23 and by operating the switching element in the multistage bridge circuit 23 in the control device 2. With this operation, the multistage bridge circuit 23 outputs an impulse-like signal to the gradient magnetic field coil. The resistance $R_1$ of the gradient magnetic field coil is obtained from the impulse response. Impulse input may be directly performed into the gradient magnetic field coil from an impulse signal generator (not illustrated), for example. The storage includes a hard disk drive (HDD), an optical disk, a magnetic tape, a semiconductor memory, a read only memory (ROM), and a random access memory (RAM).

Specifically, the resistance value $R_1$ of the gradient magnetic field coil is identified as follows. Data at N points obtained by measurement of inter-terminal voltage $v_{tm}$ and current $i_m$ of the gradient magnetic field coil at sampling period Ts when the impulse input is applied are represented by formulas (5) and 6), respectively.

$$v_{tm} = [v_{t0}\ v_{t1}\ v_{t2}\ \ldots\ v_{tN}] \quad (5)$$

$$i_m = [i_0\ i_1\ i_2\ \ldots\ i_N] \quad (6)$$

A finite impulse response (FIR) filter model applied to a portion from the PWM input to the voltage across the gradient magnetic field coil is defined as formula (7).

$$\frac{V_t(k)}{V_0(k)} = \frac{v_{t0}z^N + v_{t1}z^{N-1} + v_{t2}z^{N-2} + \ldots + v_{tN-1}z + v_{tN}}{z^N} \quad (7)$$

The FIR filter model applied to a portion from the PWM input to the current is defined as in formula (8).

$$\frac{I(k)}{V_0(k)} = \frac{i_0 z^N + i_1 z^{N-1} + i_2 z^{N-2} + \ldots + i_{N-1} z + i_N}{z^N} \quad (8)$$

From formulas (7) and (8), a transfer characteristic of a portion from the voltage across the gradient magnetic field coil to the current is obtained as formula (9).

$$\frac{I(k)}{V_t(k)} = \frac{i_0 z^N + i_1 z^{N-1} + i_2 z^{N-2} + \ldots + i_{N-1} z + i_N}{v_{t0} z^N + v_{t1} z^{N-1} + v_{t2} z^{N-2} + \ldots + v_{tN-1} z + v_{tN}} \quad (9)$$

A frequency characteristic can be calculated from the model of formula (9). For example, in order to obtain the resistance value $R_1$ of the gradient magnetic field coil, formula (10) can be obtained by setting "z=1" in the formula (9).

$$\frac{1}{R_1} = \frac{i_0 + i_1 + i_2 + \ldots + i_{N-1} + i_N}{v_{t0} + v_{t1} + v_{t2} + \ldots + v_{tN-1} + v_{tN}} \quad (10)$$

In addition to the modeling by using time-series data of impulse response in the FIR format, it is also allowable to fit the transfer characteristic in another format on the basis of a time series waveform. For example, it is allowable to assume the model as a continuous system model as a formula (11), and to perform identification by fitting parameters so as to match the measured impulse response. With this method, it is possible to obtain the inductance and the resistance value.

$$\frac{i(s)}{v_t(s)} = \frac{1}{Ls + R_1} \quad (11)$$

The voltage signal and the current signal (across the gradient magnetic field coil 110) at application of the impulse input is measured using the voltmeter 3 and the ammeter 4. By calculating the resistance value of the gradient magnetic field coil on the basis of the voltage signal and the current signal and by adding the calculated value to the resistance value $R_1$ in the high pass filter 27, by the calculation part 21, it is possible to perform estimation of the eddy currents while timely identifying the resistance value $R_1$. This makes it possible to cope with a temperature rise in the gradient magnetic field coil 110 when a large current is supplied, and a change in the resistance value due to a change in the ambient temperature.

In the case of an MRI apparatus, for example, identification of the resistance value $R_1$, may be performed per measurement of one line. Moreover, identification of the resistance value $R_1$ may be performed at a predetermined interval. The predetermined interval also includes a case where the resistance value $R_1$ is repeatedly identified at regular intervals by a program, or the like. Moreover, it includes a case where the user directly inputs from an input device (not illustrated), or the like, so as to switch to a mode for identifying the resistance value $R_1$.

With the correction device according to the present embodiment, it is possible to estimate the eddy currents more accurately by performing timely identification of the resistance $R_1$ of the gradient magnetic field coil. Moreover, in the case where a large current is supplied to the gradient magnetic field coil, the temperature of the gradient magnetic field coil rises and the resistance varies. In this case, it possible to reduce an eddy current estimation error due to the resistance change of the gradient magnetic field coil by identifying the resistance value by the correction device according to the present embodiment.

(Third Embodiment)

In the third embodiment, an MRI apparatus using the correction device according to the first or second embodiment will be described. First, a configuration of the MRI apparatus will be briefly described.

Figure 17:
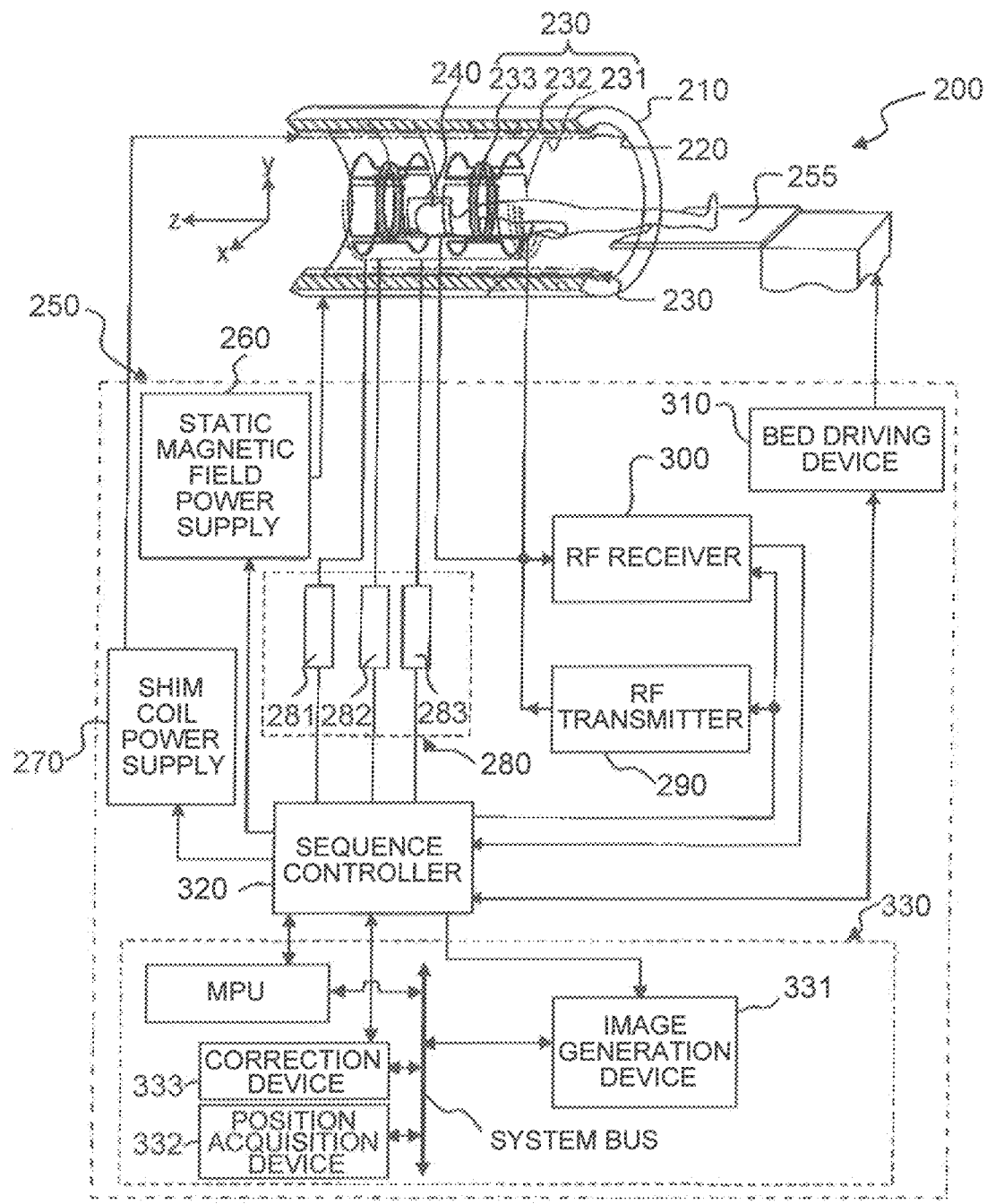
FIG. 17 is a diagram illustrating one example of configuration of an MRI apparatus.

FIG. 17 is a diagram illustrating one example of configuration of the MRI apparatus. As illustrated in FIG. 17, an MRI apparatus 200 includes a cylindrical static magnetic field magnet 210, a shim coil 220, a gradient magnetic field coil 230, an RF coil 240, control device 250, and a bed 255. The cylindrical static magnetic field magnet 210 forms a static magnetic field. The shim coil 220 is cylindrical and coaxial provided with the static magnetic field magnet 210 inside thereof. A subject H is placed on the bed 255. The control device 250 includes, for example, a static magnetic field power supply 260, a shim coil power supply 270, a gradient magnetic field power supply 280, an RF transmitter 290, an RF receiver 300, a bed driving device 310, a sequence controller 320, and a computer 330.

The static magnetic field magnet 210 is connected to the static magnetic field power supply 260 and forms a static magnetic field in an imaging space by the current supplied from the static magnetic field power supply 260. The above-described imaging space is, for example, a space in the gantry where the subject H is placed and a static magnetic field is applied. The gantry is a cylindrical structure, for example, formed so as to include the static magnetic field magnet 210, the shim coil 220, the gradient magnetic field coil 230, and the RF coil 240. The gantry and the bed 255 are configured so as to allow the bed 255 on which the subject H is placed to be moved to the inside of the gantry.

The shim coil 220 is connected to the shim coil power supply 270, and homogenizes the static magnetic field by the current supplied from the shim coil power supply 270. In many cases, the static magnetic field magnet 210 is formed with a superconducting coil, is connected to the static magnetic field power supply 260 at the time of excitation to supply a current, and is disconnected once it is excited. It is possible to form the static magnetic field magnet 210 with a permanent magnet without providing the static magnetic field power supply 260.

The gradient magnetic field coil 230 includes an X-axis gradient magnetic field coil 231, a Y-axis gradient magnetic field coil 232, a Z-axis gradient magnetic field coil 233, and is formed in a cylindrical shape inside the static magnetic field magnet 210. The X-axis gradient magnetic field coil 231, the Y-axis gradient magnetic field coil 232, and the Z-axis gradient magnetic field coil 233 are respectively connected to the X-axis gradient magnetic field power supply 281, the Y-axis gradient magnetic field power supply 282 and the Z-axis gradient magnetic field power supply 283, of the gradient magnetic field power supply 280. Then, gradient magnetic fields are individually formed in the imaging space by current supply to each of the coils from each of the power supplies.

On the basis of control information input from the sequence controller 320, the RF transmitter 290 generates an RF pulse (RF current pulse) of Larmor frequency for inducing nuclear magnetic resonance, and transmits the RF pulse (RF current pulse) to the RF coil 240 for transmission. The RF coil 240 includes a whole body coil for transmitting and receiving RF pulses contained in the gantry and a local coil for receiving an RF pulse provided in the vicinity of the bed 255 or the subject H. The RF coil 240 for transmission receives the RF pulse from the RF transmitter 290 and transmits it to the subject H. The RF coil 240 for reception receives an MR signal generated by nuclear spin in the subject H being excited by the RF pulse, and the MR signal is detected by the RF receiver 300. The RF receiver 300 performs various types of signal processing such as preamplification, intermediate frequency conversion, phase detection, low frequency amplification, filtering, onto the detected MR signal, and thereafter, performs analog-to-digital (A/D) conversion on the MR signal, thereby generating raw data which is digitized complex data. The RF receiver 300 inputs the raw data of the generated MR signal into the sequence controller 320. The RF pulse represents a radio frequency pulse, and the MR signal represents a nuclear magnetic resonance signal.

The sequence controller 320 stores control information necessary for driving the gradient magnetic field power supply 280, the RF transmitter 290, and the RF receiver 300. Herein, the control information is, for example, sequence information describing operation control information such as the intensity, application time, and application timing, of the pulse current to be applied to the gradient magnetic field power supply 280. The sequence controller 320 generates the gradient magnetic field and the RF pulse by driving the gradient magnetic field power supply, the RF transmitter 290 and the RF receiver 300 in accordance with the stored predetermined sequence. Moreover, the sequence controller 320 receives the raw data of the MR signal input from the RF receiver 300, and inputs the raw data into the computer 330.

The computer 330 includes an image generation device 331, a position acquisition device 332, and a correction device 333. The image generation device 331 reconstructs the image data of the subject H on the basis of the MR signal. The position acquisition device 332 obtains an imaging region as positional information in the imaging space. The correction device according to the first or second embodiment is used in the computer 330 and functions as the correction device 333 for a magnetic field generated by the gradient magnetic field coil 230.

The correction device 333 estimates the influence of the eddy currents generated by the neighboring conductor together with application of the current to the gradient magnetic field coil 230, and corrects the current command value applied to the gradient magnetic field in accordance with the time constant of the eddy currents. With this configuration, it is possible to prevent magnetic field distortion due to the eddy currents and to obtain clearer image data.

Moreover, there is no need to place a phantom in filter setting at installation of the MRI apparatus, and it is possible to correct the current command value according to the change in the time constant of the eddy currents.

Moreover, even if the conductor inside the MRI apparatus changes in a characteristic due to temperature change, the influence onto the gradient magnetic field due to the eddy currents can be eliminated.

While the first to third embodiments describe a case where the coils are limited to the gradient magnetic field coils, the coils are not limited thereto, and can be applied to various coils having conductors in the vicinity of the coils. For example, applicable coils include a coil of a longitudinal rotating electric machine, a coil of a lateral rotating electric machine, and a voice coil motor (VCM) of a hard disk drive (HDD).

Moreover, the correction device according to the first and second embodiments is not limited to the MRI apparatus, and also applicable to an eddy current displacement meter, or the like.

While certain embodiments have been described, these embodiments have been presented by way of examples only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A correction device used for an apparatus including a coil and a conductor in a vicinity of the coil, and for correcting an influence of a magnetic field generated by the conductor when a current flows through the coil,
    the correction device comprising:
    a first measuring device that measures a first signal of the coil;
    a second measuring device that measures a second signal of the coil, which is different from the first signal; and
    a control device that estimates the influence of the magnetic field acting on the coil, based on a difference between the first signal filtered by a first filter and the second signal filtered by a second filter, and corrects a command signal for flowing the current to the coil, based on an estimation result of the influence of the magnetic field,
    wherein the control device obtains the estimation result, based on an inductance and a resistance value of the coil.

2. The correction device according to claim 1, wherein the control device further includes an integrating circuit that integrates the difference between the filtered first signal and the filtered second signal.

3. The correction device according to claim 2, wherein the control device further includes a gain adjuster that multiplies a signal of the difference integrated by the integrating circuit, with a gain.

4. The correction device according to claim 1, wherein the first filter filters a high frequency component of the first signal, and
    the second filter filters a low frequency component of the second signal.

5. The correction device according to claim 1, wherein the first measuring device is connected to a portion between the second measuring device and the coil.

6. The correction device according to claim 1, wherein,
    in the case where the first signal is represented by $v_1$, the second signal is represented by $i_1$, the inductance of the coil is represented by $L_1$, the resistance of the coil is represented by $R_1$, the current flowing through the conductor is represented by $i_2$, a mutual inductance of the coil and the conductor is represented by $M_{12}$,
    the estimation result is expressed by following equation $$M_{12}\frac{di_2}{dt} = v_1 - \left(L_1\frac{di_1}{dt} + R_1 i_1\right).$$

7. A correction method to be performed by a computer used for a magnetic resonance imaging (MRI) apparatus including a coil and a conductor in a vicinity of the coil and for correcting an influence of a magnetic field generated by the conductor when a current flows through the coil,
the correction method comprising:
measuring, by the computer, a first signal of the coil;
measuring, by the computer, a second signal of the coli, which is different from the first signal;
estimating, by the computer, the influence of the magnetic field acting on the coil, based on a difference between the first signal filtered by a first filter and the second signal filtered by a second filter; and
correcting, by the computer, a command signal for flowing the current to the coil in the MRI apparatus, based on an estimation result of the influence of the magnetic field,
wherein the correcting includes
obtaining the estimation result, based on an inductance and a resistance value of the coil.

8. A magnetic resonance imaging apparatus comprising:
the correction device according to claim 1; and
at least one of a gantry and an image generation device.

\* \* \* \* \*